(12) United States Patent
Suematsu

(10) Patent No.: US 11,013,102 B2
(45) Date of Patent: *May 18, 2021

(54) PRINTED CIRCUIT BOARD AND ELECTRONIC DEVICE

(71) Applicant: SEIKO EPSON CORPORATION, Tokyo (JP)

(72) Inventor: Naoki Suematsu, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/992,264

(22) Filed: Aug. 13, 2020

(65) Prior Publication Data

US 2020/0375017 A1 Nov. 26, 2020

Related U.S. Application Data

(63) Continuation of application No. 16/173,708, filed on Oct. 29, 2018, now Pat. No. 10,779,390.

(30) Foreign Application Priority Data

Oct. 30, 2017 (JP) .............................. JP2017-209576

(51) Int. Cl.
*H05K 1/02* (2006.01)
*H05K 7/20* (2006.01)
(Continued)

(52) U.S. Cl.
CPC ....... *H05K 1/0203* (2013.01); *H01L 23/4006* (2013.01); *H01L 23/552* (2013.01);
(Continued)

(58) Field of Classification Search
CPC combination set(s) only.
See application file for complete search history.

(56) References Cited

U.S. PATENT DOCUMENTS

| 2,939,513 A | 6/1960 | Leslie |
| 5,011,318 A | 4/1991 | Gilmore |

(Continued)

FOREIGN PATENT DOCUMENTS

| JP | H09-017921 A | 1/1997 |
| JP | H10-092988 A | 4/1998 |

(Continued)

OTHER PUBLICATIONS

Apr. 4, 2019 Office Action issued in U.S. Appl. No. 16/173,708.
(Continued)

*Primary Examiner* — William H. Mayo, III
*Assistant Examiner* — Krystal Robinson
(74) *Attorney, Agent, or Firm* — Oliff PLC

(57) ABSTRACT

A printed circuit board includes a printed wiring board, an electronic element provided on a mounting surface of the printed wiring board, and a heat radiation member provided on an opposite side of a side on which the printed wiring board is positioned with respect to the electronic element, the heat radiation member thermally connected to the electronic element. An end portion of the heat radiation member is disposed closer to the printed wiring board than a connection portion with the electronic element in the heat radiation member, in a state where a space is provided between the end portion and the printed wiring board.

8 Claims, 4 Drawing Sheets

(51) Int. Cl.
  *H01L 23/552* (2006.01)
  *H01L 23/40* (2006.01)
  *H01L 23/367* (2006.01)
  *H01L 23/42* (2006.01)

(52) U.S. Cl.
  CPC ........ *H05K 7/2039* (2013.01); *H01L 23/3675* (2013.01); *H01L 23/42* (2013.01); *H01L 2023/4075* (2013.01); *H05K 2201/066* (2013.01)

(56) References Cited

U.S. PATENT DOCUMENTS

| | | | |
|---|---|---|---|
| 5,048,886 A | 9/1991 | Ito et al. | |
| 5,060,114 A | 10/1991 | Feinberg et al. | |
| 5,367,434 A * | 11/1994 | Griffin | H01L 23/36 174/252 |
| 5,471,027 A * | 11/1995 | Call | H01L 21/563 219/85.13 |
| 5,483,853 A | 1/1996 | Moradell et al. | |
| 5,668,357 A | 9/1997 | Takiguchi et al. | |
| 5,787,976 A * | 8/1998 | Hamburgen | F28F 3/02 165/185 |
| 5,950,978 A | 9/1999 | Eguchi et al. | |
| 6,226,184 B1 * | 5/2001 | Stolz | G06F 1/20 165/185 |
| 6,246,115 B1 * | 6/2001 | Tang | H01L 21/565 257/675 |
| 6,429,544 B1 | 8/2002 | Sasaki et al. | |
| 6,962,753 B1 | 11/2005 | Yoshida et al. | |
| 7,221,768 B2 * | 5/2007 | Sjursen | H04R 25/604 381/322 |
| 7,265,984 B2 | 9/2007 | Numata | |
| 8,059,423 B2 * | 11/2011 | Biunno | H05K 1/162 361/763 |
| 8,213,180 B2 * | 7/2012 | Zhao | H01L 23/552 361/720 |
| 3,240,027 A1 | 8/2012 | Egitto et al. | |
| 8,240,027 B2 * | 8/2012 | Egitto | H05K 1/167 29/620 |
| 8,353,561 B2 | 1/2013 | Yamazaki et al. | |
| 8,379,390 B2 | 2/2013 | Inoue | |
| 8,564,121 B2 * | 10/2013 | Ihara | H01L 23/552 257/707 |
| 8,686,286 B2 | 4/2014 | Sekino et al. | |
| 9,401,591 B2 | 7/2016 | Satou et al. | |
| 9,573,536 B2 | 2/2017 | Katou et al. | |
| 9,907,208 B2 | 2/2018 | Bose et al. | |
| 10,038,314 B2 | 7/2018 | Satou et al. | |
| 10,103,087 B2 * | 10/2018 | Jin | H01L 23/3737 |
| 10,424,494 B2 * | 9/2019 | Colgan | H05K 3/303 |
| 2001/0010424 A1 | 8/2001 | Osmer et al. | |
| 2001/0050428 A1 * | 12/2001 | Ando | H01L 23/24 257/700 |
| 2002/0050730 A1 | 5/2002 | Kondo et al. | |
| 2005/0035622 A1 | 2/2005 | Tsubaki et al. | |
| 2006/0176672 A1 | 8/2006 | Kamemoto et al. | |
| 2006/0199416 A1 | 9/2006 | Tsubaki | |
| 2007/0040267 A1 * | 2/2007 | Zhao | H01L 23/433 257/706 |
| 2007/0045835 A1 * | 3/2007 | Lin | H01L 23/3114 257/734 |
| 2007/0108599 A1 * | 5/2007 | Im | H01L 23/3128 257/712 |
| 2008/0142260 A1 | 6/2008 | Yamaguchi | |
| 2008/0310119 A1 * | 12/2008 | Giacoma | H01L 23/4093 361/719 |
| 2009/0166653 A1 * | 7/2009 | Weaver, Jr. | F21K 9/64 257/98 |
| 2009/0245800 A1 * | 10/2009 | Sone | H04J 14/0247 398/79 |
| 2010/0097768 A1 * | 4/2010 | Ishii | H05K 7/20454 361/719 |
| 2011/0031610 A1 * | 2/2011 | Yamazaki | H01L 25/16 257/693 |
| 2011/0096505 A1 | 4/2011 | Inoue | |
| 2011/0176279 A1 * | 7/2011 | Zhao | H01L 23/4093 361/720 |
| 2015/0271949 A1 * | 9/2015 | Kim | H05K 7/2039 361/699 |
| 2015/0319880 A1 | 11/2015 | Strickland et al. | |
| 2016/0044826 A1 * | 2/2016 | Hartl | H05K 7/2039 361/709 |
| 2016/0324031 A1 * | 11/2016 | Fujiwara | B32B 9/045 |
| 2018/0260003 A1 | 9/2018 | Honma et al. | |
| 2019/0364696 A1 * | 11/2019 | Mujcinovic | H05K 7/1418 |
| 2020/0246625 A1 * | 8/2020 | Stevenson | A61N 1/3754 |

FOREIGN PATENT DOCUMENTS

| | | |
|---|---|---|
| JP | 2002-368481 A | 12/2002 |
| JP | 2011-023469 A | 2/2011 |
| JP | 2011-054640 A | 3/2011 |

OTHER PUBLICATIONS

Oct. 4, 2019 Office Action issued in U.S. Appl. No. 16/173,708.
Feb. 4, 2020 Office Action issued in U.S. Appl. No. 16/173,708.
May 20, 2020 Notice of Allowance issued in U.S. Appl. No. 16/173,708.

* cited by examiner

PRINTED CIRCUIT BOARD AND ELECTRONIC DEVICE

CROSS-REFERENCE TO RELATED APPLICATION(S)

This application is a continuation of U.S. application Ser. No. 16/173,708 filed Oct. 29, 2018, which is based on and claims priority under 35 U.S.C. 119 from Japanese Patent Application No. 2017-209576 filed on Oct. 30, 2017. The contents of the above applications are incorporated herein by reference.

BACKGROUND

1. Technical Field

The present invention relates to a printed circuit board and an electronic device.

2. Related Art

In the related art, there is known a printed circuit board including a printed wiring board, and a high heat-generating electronic element that is mounted on the printed wiring board. As such a printed circuit board, there is known a printed circuit board including a heat radiation board that radiates heat which is transferred from the electronic element (for example, see JP-A-9-17921).

In the printed circuit board disclosed in JP-A-9-17921, a metal block is bonded to an upper portion of an integrated circuit with a thermally conductive adhesive, and a metal board as a heat radiation board is disposed in the metal block. In such a printed circuit board, the heat which is generated in the integrated circuit is transferred to the metal board through the metal block and the thermally conductive adhesive, and is radiated by the metal board, thereby, the integrated circuit is cooled.

Meanwhile, there is a case where the printed circuit board radiates a noise current which is generated in the integrated circuit or the like, as an electromagnetic wave, to an outside. In such a case, there is a possibility that a malfunction is caused in a peripheral circuit or an electronic device. Particularly, in the printed circuit board disclosed in JP-A-9-17921, there is a problem that a noise current which is generated in the integrated circuit or the like is propagated to the heat radiation board, the heat radiation board serves as an antenna, the electromagnetic wave is widely radiated on a periphery thereof, and an influence on a peripheral electronic device becomes large.

On the contrary, in the printed circuit board disclosed in JP-A-9-17921, the heat radiation board is connected to a signal ground of a printed substrate, through a conductive stud. Therefore, the noise current which is propagated to the heat radiation board is propagated to the printed substrate through the stud, thereby, the electromagnetic wave is prevented from being radiated from the heat radiation board.

However, in the printed circuit board disclosed in JP-A-9-17921, since the heat radiation board is in a mere flat board shape, there is a problem that the noise current is more likely to be radiated on the periphery as an electromagnetic wave from an end portion of the heat radiation board than to be propagated to the printed substrate side through the stud.

Therefore, a configuration that is capable of preventing the electromagnetic wave from being radiated on the periphery is demanded.

SUMMARY

An advantage of some aspects of the invention is to provide a printed circuit board that is capable of preventing an electromagnetic wave from being radiated to an outside.

A printed circuit board according to an aspect of the invention includes a printed wiring board, an electronic element provided on a mounting surface of the printed wiring board, and a heat radiation member provided on an opposite side of a side on which the printed wiring board is positioned with respect to the electronic element, the heat radiation memeber thermally connected to the electronic element, in which an end portion of the heat radiation member is disposed closer to the printed wiring board than a connection portion with the electronic element in the heat radiation member, in a state where a space is provided between the end portion and the printed wiring board.

According to such a configuration, a noise current which is generated in the electronic element to be propagated to the heat radiation member is propagated to the printed wiring board from the end portion of the heat radiation member. Since the end portion is disposed closer to the printed wiring board than the connection portion with the electronic element in the heat radiation member, a distance between the end portion of the heat radiation member and the printed wiring board becomes short. Thereby, since it is possible to shorten a propagation path of the noise current which is propagated to the printed wiring board from the end portion of the heat radiation member, it is possible to easily propagate the noise current to the printed wiring board. Accordingly, it is possible to prevent the noise current from being radiated to an outside of the printed circuit board as an electromagnetic wave, and it is possible to reduce an influence on a peripheral electronic device.

In the aspect, it is preferable that the end portion has a shape which is bent toward the printed wiring. Further, in the aspect, it is preferable that the end portion has a shape which is curved toward the printed wiring board.

According to such a configuration, it is possible to dispose the end portion as described above, in accordance with the shape of the end portion. Accordingly, it is possible to form the heat radiation member that achieves effects described above, without complicating the heat radiation member.

In the aspect, it is preferable that the mounting surface and an end surface facing the mounting surface in the end portion are parallel to each other.

Here, in a case where the end portion does not have the end surface, and a tip of the end portion is in a shape which is sharp toward the printed wiring board side, since a facing area of a portion corresponding to the tip becomes relatively small in the printed wiring board facing the tip, the noise current which is propagated to the printed wiring board from the tip of the end portion of the heat radiation member becomes small. Thereby, the noise current which is not propagated to the printed wiring board becomes the electromagnetic wave to be radiated, and there is a possibility that the electromagnetic wave which is radiated to the outside is increased.

On the contrary, according to the configuration described above, it is possible to increase the facing area of the portion corresponding to the end portion in the printed wiring board facing the end portion, in comparison with a case where the tip is in the shape which is sharp toward the printed wiring board. Thereby, it is possible to strengthen a coupling between the end portion of the heat radiation member and the facing area of the printed wiring board, in the same manner as a capacitive coupling of a capacitor, and it is possible to increase the noise current which is propagated to the printed wiring board from the end portion. Accordingly, it is possible to prevent the electromagnetic wave from being radiated to the outside of the printed circuit board, and it is possible to reduce the influence on the peripheral electronic device.

In the aspect, it is preferable that the printed circuit board further includes a heat transfer member disposed between the electronic element and the heat radiation member.

As such a heat transfer member, it is possible to exemplify a sheet-shaped heat transfer member.

According to such a configuration, it is possible to efficiently transfer heat which is generated in the electronic element to the heat radiation member by the heat transfer member. Accordingly, it is possible to enhance cooling efficiency of the electronic element.

In the aspect, it is preferable that the printed wiring board has a ground at a position corresponding to the end portion.

According to such a configuration, it is possible to easily propagate the noise current which heads toward the printed wiring board from the end portion of the heat radiation member to the ground of the printed wiring board. That is, it is possible to further increase the noise current which is propagated to the printed wiring board from the end portion of the heat radiation member. Accordingly, it is possible to effectively prevent the electromagnetic wave from being radiated to the outside of the printed circuit board, and it is possible to further reduce the influence on the peripheral electronic device.

An electronic device according to an aspect of the invention includes the printed circuit board according to one of the above configuration.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the drawings.

Configuration of Printed Circuit Board

Figure 1:
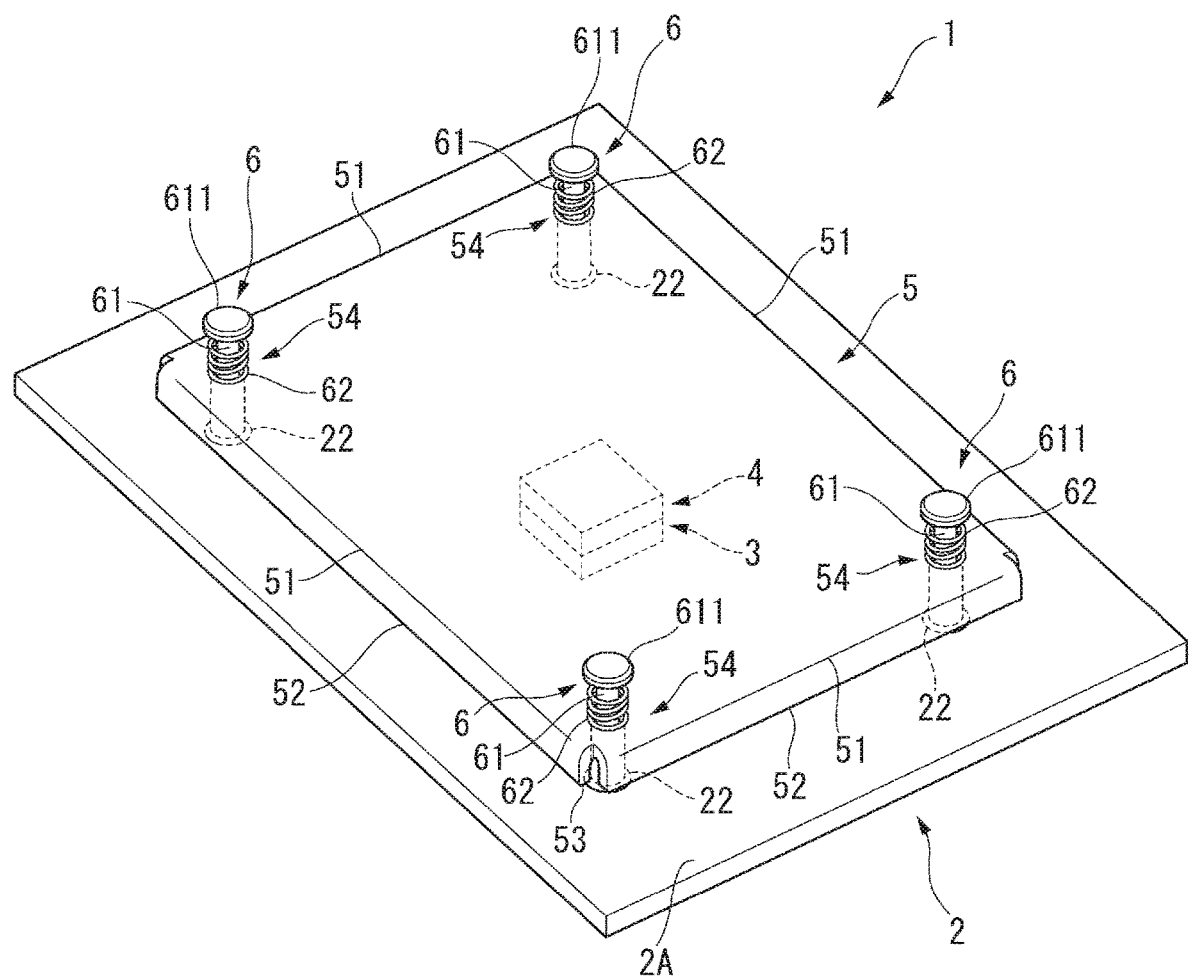
FIG. 1 is a perspective view illustrating an outline of a printed circuit board according to an embodiment of the invention.
Figure 2:
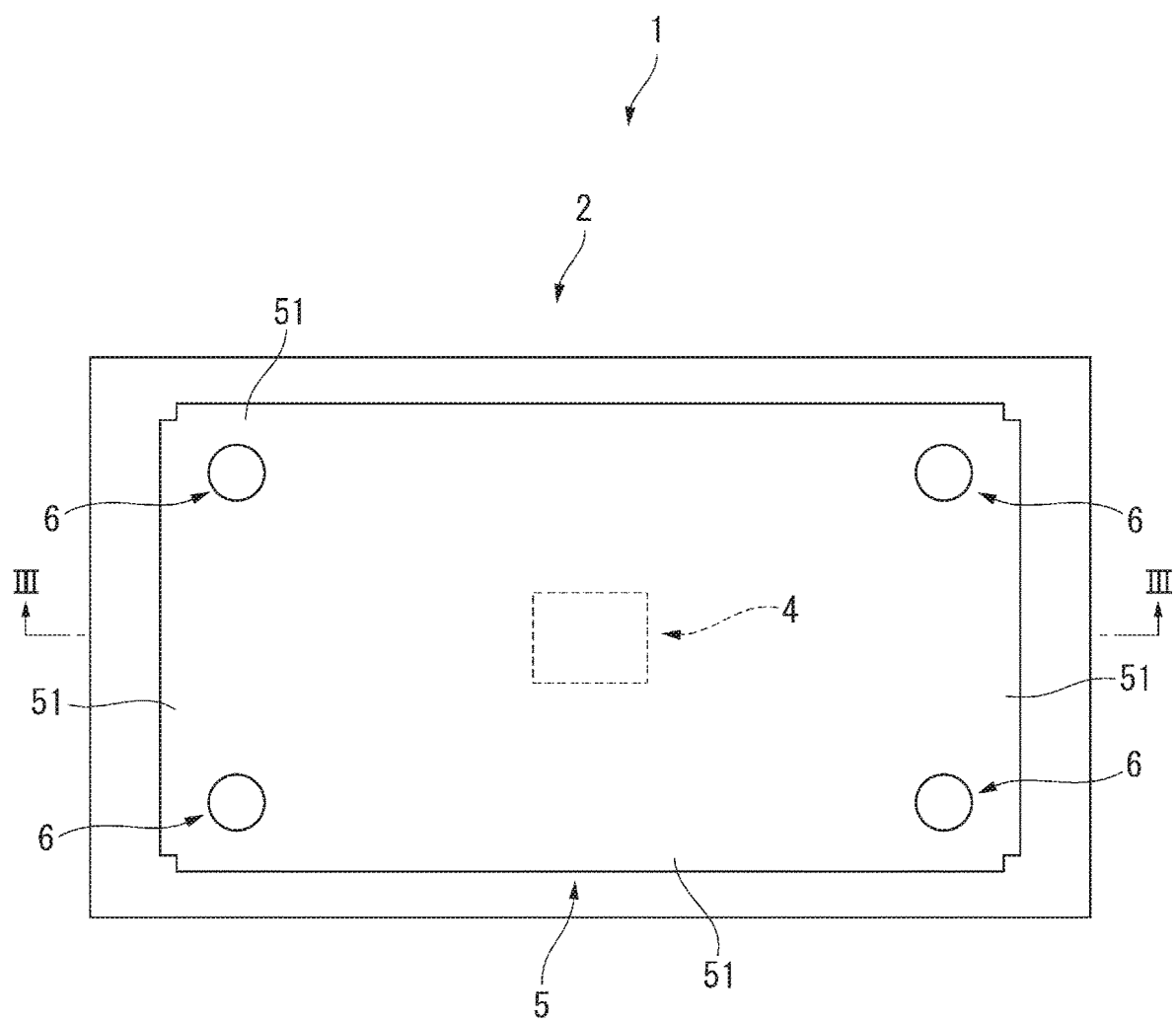
FIG. 2 is a plan view illustrating the printed circuit board according to the embodiment.
Figure 3:
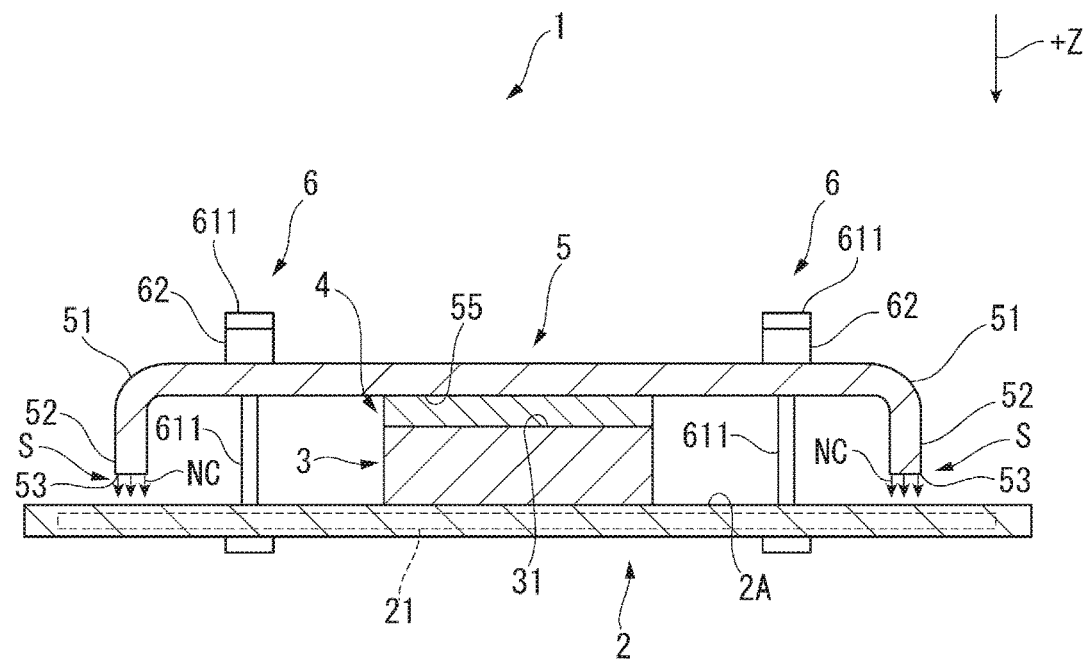
FIG. 3 is a sectional view illustrating the printed circuit board according to the embodiment.

FIG. 1 is a perspective view illustrating a printed circuit board 1 according to the embodiment, and FIG. 2 is a plan view illustrating the printed circuit board 1. FIG. 3 is a sectional view of the printed circuit board 1 taken along line in FIG. 2.

The printed circuit board 1 according to the embodiment is a printed circuit board that is adopted in an electronic device or the like. As illustrated in FIGS. 1 to 3, the printed circuit board 1 includes a printed wiring board 2, an electronic element 3, a heat transfer member 4, a heat radiation board 5, and a fixing member 6.

The printed wiring board 2 is a printed substrate which is in a rectangular shape in a planar view. The printed wiring board 2 has a ground layer 21 which becomes a ground in the printed circuit board 1. The ground layer 21 is provided as an inner layer on an inside of the printed wiring board 2, and is provided up to an outside rather than a position corresponding to an end surface 53 of the heat radiation board 5 described later, in the printed wiring board 2 in the planar view. That is, the printed wiring board 2 has the ground at a position corresponding to an end portion 52 described later.

The electronic element 3 is an electric circuit element which uses a semiconductor as a base material. The electronic element 3 is attached to a mounting position on a mounting surface 2A of the printed wiring board 2.

In the electronic element 3, if an electrical current is supplied through the printed wiring board 2, heat is generated due to internal circuit resistance or the like. If a temperature of the electronic element 3 rises to be a specified value or more due to the heat generation, there is concern that performance thereof is lowered or a damage is caused. Therefore, in the printed circuit board 1 according to the embodiment, the heat which is generated in the electronic element 3 is transferred to the heat radiation board 5 described later through the heat transfer member 4, and the heat is radiated by the heat radiation boards, thereby, the electronic element 3 is cooled.

In the electronic element 3, if the electrical current is supplied through the printed wiring board 2, a noise current NC is generated. In a case where the heat radiation board 5 is provided to the printed circuit board 1 in the same manner as the embodiment, the noise current NC is propagated to the heat radiation board 5 through the heat transfer member 4, and is radiated as an electromagnetic wave EW from the heat radiation board 5. The electromagnetic wave EW which is radiated from the heat radiation board 5 will be described later in detail.

The heat transfer member 4 is disposed between the electronic element 3 and the heat radiation board 5, and transfers the heat to the heat radiation board 5 from the electronic element 3. In the embodiment, the heat transfer member 4 is formed of a sheet which is excellent in thermal conductivity, is flexible, and is high in adhesion. As illustrated in FIG. 3, one surface of the heat transfer member 4 is stuck to a facing surface 31 that is a surface which is an opposite side of a surface of a side on which the printed wiring board 2 is positioned with respect to the electronic element 3. The other surface of the heat transfer member 4 is stuck to a surface of a side on which the printed wiring board 2 is positioned in the heat radiation board 5. Thereby, it is possible to eliminate an air layer which causes efficiency of the heat transfer to be lowered between the electronic element 3 and the heat radiation board 5, and it is possible to easily transfer the heat which is generated in the electronic element 3 to the heat radiation board 5.

The heat radiation board 5 is a metal board which has a rectangular shape in the planar view, and of which a notch is provided at each of four corners. For example, the heat radiation board 5 is formed by bending end portions of four side of a sheet metal with bending processing or the like. The heat radiation board 5 is thermally connected to the electronic element 3 through the heat transfer member 4. The heat radiation board 5 is equivalent to a heat radiation member. The heat radiation board 5 is formed to be larger than the electronic element 3, and is formed to be smaller than the printed wiring board 2, in the planar view. A direction (planar view direction of the printed wiring board 2) which is perpendicular to the mounting surface 2A of the printed wiring board 2 is referred to as Z direction. In the Z direction, a direction which heads to the printed wiring board 2 from the heat radiation board 5 is referred to +Z direction.

The heat radiation board 5 has a connection portion 55 as a portion which is thermally connected to the electronic element 3. Ina case where the printed circuit board 1 is viewed along the +Z direction, the connection portion 55 of the heat radiation board 5 is a portion of the heat radiation board 5 corresponding to an outer shape of the electronic element 3, or an outer shape of the member (heat transfer member 4 in the embodiment) which is disposed between the heat radiation board 5 and the electronic element 3. In the embodiment, the connection portion 55 of the heat radiation board 5 is connected to the electronic element 3 through the heat transfer member 4, but the connection portion 55 is not limited thereto. For example, the connection portion 55 may be connected to the electronic element 3 by being in contact directly with the electronic element 3 without being connected through the heat transfer member 4, or may be connected to the electronic element 3 through a member other than the heat transfer member 4. For example, the connection portion 55 may be connected to the electronic element 3 through the heat transfer member 4 and the member other than the heat transfer member 4, that is, two or more members.

As illustrated in FIG. 3, the end portion 52 of the heat radiation board 5 is disposed closer to the printed wiring board 2 than the connection portion 55 with the electronic element 3 in the heat radiation board 5, in a state where a space S is provided between the end portion 52 and the printed wiring board 2. In other words, in the heat radiation board 5, the end portions 52 of four sides which are positioned on the outside of the electronic element 3 in a case where the printed circuit board 1 is viewed along the +Z direction, are disposed closer to the printed wiring board 2 than the facing surface 31 of the electronic element 3.

In detail, in a case where the printed circuit board 1 is viewed along the +Z direction, the heat radiation board 5 has a deformation portion 51 which is bent to the printed wiring board 2, in a portion which reaches to an outer periphery of the heat radiation board 5 from the connection portion 55. That is, the end portion 52 has a shape that is bent to the printed wiring board 2. In a case where the heat radiation board 5 is attached to the printed wiring board 2, the end portion 52 of the heat radiation board 5 is disposed closer to the printed wiring board 2 than the connection portion 55, due to the deformation portion 51. That is to say, the end portion 52 of the heat radiation board 5 is disposed at a position which is closer to the printed wiring board 2 than the connection portion 55 with the electronic element 3 in the heat radiation board 5, in the direction (Z direction) which is perpendicular to the mounting surface 2A of the printed wiring board 2, in the state where the space S is provided between the end portion 52 and the printed wiring board 2.

The end portion 52 has the end surface 53 on a tip side. In the embodiment, the heat radiation board 5 is provide with the deformation portion 51, thereby, the end surface 53 and the mounting surface 2A of the printed wiring board 2 are disposed to face each other. As illustrated in FIG. 3, the end surface 53 facing the mounting surface 2A is substantially parallel to the mounting surface 2A. At this time, the space S is formed between the end surface 53 and the mounting surface 2A, as described above. In other words, the heat radiation board 5 is attached to the printed wiring board 2 such that a gap is formed between the end surface 53 and the mounting surface 2A. That is, the space S is provided, thereby, the end portion 52 of the heat radiation board 5 and the printed wiring board 2 are not in contact physically with each other.

A case where the end surface 53 and the mounting surface 2A are substantially parallel to each other not only includes a scope which is recognizable as parallel, but also includes a case of being fully parallel to each other.

The fixing member 6 is a fastening tool which has conductivity, and is made of a metal, and the heat radiation board 5 is attached to the printed wiring board 2. In the embodiment, the fixing members 6 are provided as four. Each fixing member 6 has a shaft member 61 that is inserted into each of four hole portions 54 which are formed in the vicinity of four corners of the heat radiation board 5, along+Z direction, and a biasing member 62 that is provided with the shaft member 61.

The shaft member 61 is inserted through the hole portion 54 of the heat radiation board 5, and is fixed to an insertion hole 22 that is formed in the printed wiring board 2. When the shaft member 61 is inserted into the hole portion 54 of the heat radiation board 5, the shaft member 61 has a head portion 611 that is positioned on the opposite side of the printed wiring board 2 side with respect to the heat radiation board 5. Therefore, the biasing member 62 is disposed between the head portion 611 and the heat radiation board 5.

In the embodiment, the biasing member 62 is formed of a compression coil spring, and biases the heat radiation board 5 toward the printed wiring board 2 side. Due to the biasing member 62, the heat radiation board 5 is fastened to the heat transfer member 4, and the heat transfer member 4 is fastened to the electronic element 3. Therefore, it is possible to easily propagate the heat which is generated in the electronic element 3 to the heat radiation board 5.

Since the insertion hole 22 is connected to the ground layer 21, a portion of the noise current NC which is propagated to the heat radiation board 5 from the electronic element 3 is propagated to the printed wiring board 2 through the fixing member 6. However, the noise current which is propagated to the printed wiring board 2 through the fixing member 6 is smaller than the noise current which is propagated up to the end portion 52 of the heat radiation board 5. Therefore, even in a case where the printed circuit board 1 is configured to include the fixing member 6, there is a concern that the electromagnetic wave EW is radiated to the outside from the end portion 52 of the heat radiation board 5.

Flow of Noise Current NC Propagating Through Printed Circuit Board

Figure 4:
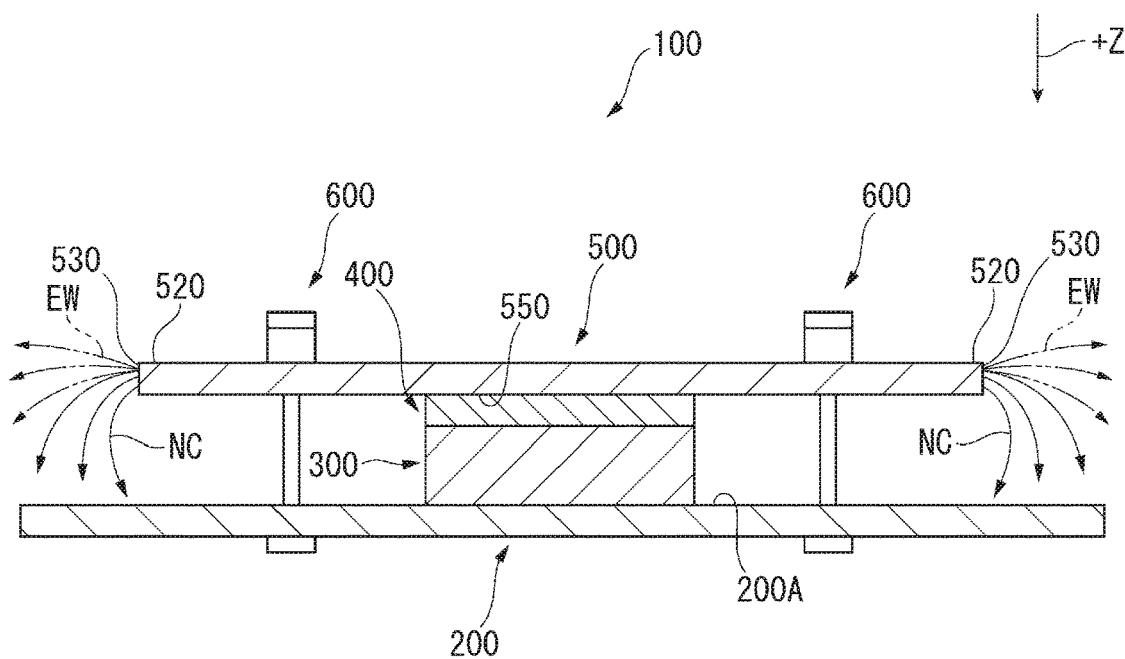
FIG. 4 is a sectional view illustrating a printed circuit board in the related art.

FIG. 4 is a sectional view illustrating a printed circuit board 100 in the related art.

Here, a propagation path of the noise current NC in the printed circuit board 100 of the related art will be described. The noise current NC is indicated by an arrow of a solid line in FIG. 4.

As illustrated in FIG. 4, the printed circuit board 100 has a printed wiring board 200, an electronic element 300, a heat transfer member 400, a heat radiation board 500, and a fixing member 600. The heat radiation board 500 does not have the deformation portion 51 in the embodiment of the invention, and is formed as a flat board of a rectangular shape. That is, an end surface 530 of an end portion 520 in the heat radiation board 500 is substantially perpendicular to a mounting surface 200A of the printed wiring board 200, differently from the end surface 53 of the end portion 52 in the embodiment of the invention. That is to say, the end surface 530 is formed to be disposed along the Z direction. Furthermore, the heat radiation board 500 has a connection portion 550 as a portion that is thermally connected to the electronic element 300 through the heat transfer member 400. In the printed circuit board 100, the end portion 520 of the heat radiation board 500 is disposed at a position which is distant from the printed wiring board 200 rather than the connection portion 550, or at a position of which distances from the printed wiring board 200 are approximately the same, in the Z direction being a direction which is perpendicular to the mounting surface 200A of the printed wiring board 200.

In the printed circuit board 100, a portion of the noise current NC which is generated in the electronic element 300 to be propagated to the heat radiation board 500, is propagated to the printed wiring board 200, as illustrated in FIG. 4. However, in the printed circuit board 100, since the distance between the end portion 520 and the mounting surface 200A of the printed wiring board 200, that is, the distance between the end surface 530 and the mounting surface 200A is relatively long, the propagation path of the noise current NC which is propagated to the printed wiring board 200 from the heat radiation board 500 becomes long. Therefore, the noise current NC which heads to the printed wiring board 200 from the end surface 530 is hardly likely to be propagated to the printed wiring board 200, and a portion of the noise current NC is radiated to the outside of the printed circuit board 100 as an electromagnetic wave EW. The electromagnetic wave EW is indicated by an arrow of a two-dot chain line in FIG. 4.

In this manner, since the electromagnetic wave EW which is radiated from the end surface 530 of the heat radiation board 500 is likely to be propagated to a peripheral electronic device, an influence on the peripheral electronic device becomes large.

On the contrary, in the printed circuit board 1 according to the embodiment, the noise current NC which is generated in the electronic element 3 is propagated to the heat radiation board 5 through the heat transfer member 4. As described above, the noise current NC which is propagated to the heat radiation board 5, is propagated to the printed wiring board 2 from the end portion 52. At this time, since the deformation portion 51 is bent to the printed wiring board 2, the end portion 52 of the heat radiation board 5 is disposed closer to the printed wiring board 2 (mounting surface 2A) than the connection portion 55 with the electronic element 3 in the heat radiation board 5. Thereby, since the distance between the end portion 52 (end surface 53) and the mounting surface 2A of the printed wiring board 2 becomes short, and it is possible to shorten the propagation path of the noise current NC which is propagated to the printed wiring board 2 from the heat radiation board 5, it is possible to easily propagate the noise current NC which is propagated to the heat radiation board 5 from the electronic element 3, to the printed wiring board 2 from the end surface 53. Accordingly, it is possible to prevent the noise current NC from being radiated to the outside as an electromagnetic wave EW from the printed circuit board 1, and it is possible to reduce the influence on the peripheral electronic device.

Here, the end surface 53 is substantially parallel to the mounting surface 2A. Thereby, for example, it is possible to increase a facing area of a portion corresponding to the end portion 52 in the printed wiring board 2 facing the end portion 52, in comparison with a case where the tip of the end portion 52 is in a shape which is sharp toward the printed wiring board 2 (mounting surface 2A) side. Thereby, it is possible to strengthen a coupling between the end portion 52 of the heat radiation board 5 and the facing area of the printed wiring board 2, in the same manner as a capacitive coupling of a capacitor, and it is possible to increase the noise current NC which is propagated to the printed wiring board 2 from the end portion 52. Accordingly, it is possible to prevent the electromagnetic wave EW from being radiated to the outside of the printed circuit board 1, and it is possible to reduce the influence on the peripheral electronic device.

The printed wiring board 2 has the ground layer 21 at the position corresponding to the end surface 53 of the heat radiation board 5. Thereby, it is possible to easily propagate the noise current NC which heads to the printed wiring board 2 from the end portion 52 of the heat radiation board 5, to the ground layer 21 of the printed wiring board 2. Accordingly, it is possible to effectively prevent the electromagnetic wave EW from being radiated to the outside of the printed circuit board 1, and it is possible to further reduce the influence on the peripheral electronic device.

Furthermore, there is a case where the electromagnetic wave which is radiated from the peripheral electronic device, as a noise current, is propagated to the printed circuit board 1 of which the heat radiation board 5 serves as an antenna. In this case, the noise current which is propagated to the heat radiation board 5 is propagated to the ground layer 21 of the printed wiring board 2 from the end surface 53 of the heat radiation board 5, as described above. Thereby, it is possible to prevent the electromagnetic wave which is radiated from the peripheral electronic device from being propagated to the electronic element 3, and it is possible to reduce the influence on the electronic element 3 due to the electromagnetic wave which is radiated from the peripheral electronic device.

Effect of Embodiment

According to the printed circuit board 1 of the embodiment described above, the following effects are obtained.

In the printed circuit board 1, the end surface 53 of the heat radiation board 5 is disposed closer to the printed wiring board 2 (mounting surface 2A) than the connection portion 55 of the heat radiation board 5, in the state where the space S is provided between the end surface 53 and the printed wiring board 2. Thereby, since it is possible to shorten the propagation path of the noise current NC which is propagated to the printed wiring board 2 from the heat radiation board 5, it is possible to easily propagate the noise current NC to the printed wiring board 2 from the end surface 53 in the heat radiation board 5. Accordingly, it is possible to prevent the electromagnetic wave EW from being radiated to the outside from the printed circuit board 1, and it is possible to reduce the influence on the peripheral electronic device.

Since the end portion 52 has the shape which is bent to the printed wiring board 2, it is possible to dispose the end portion 52 as described above. Accordingly, it is possible to form the heat radiation board 5 that achieves the effects described above, without complicating the heat radiation board 5.

The end surface 53 is substantially parallel to the mounting surface 2A. According thereto, since it is possible to increase the facing area of the portion facing the end surface 53 of the heat radiation board 5 in the mounting surface 2A, it is possible to increase the noise current NC which is propagated to the printed wiring board 2 from the end surface 53 of the heat radiation board 5. Accordingly, it is possible to prevent the electromagnetic wave EW from being radiated to the outside of the printed circuit board 1, and it is possible to reduce the influence on the peripheral electronic device.

The printed wiring board 2 has the ground layer 21 at the position corresponding to the end surface 53 of the heat radiation board 5. Thereby, it is possible to easily propagate the noise current NC which heads to the printed wiring board 2 from the end portion 52 of the heat radiation board 5, to the ground layer 21 of the printed wiring board 2, and it is possible to effectively prevent the electromagnetic wave EW from being radiated to the outside of the printed circuit board 1.

There is a case where the electromagnetic wave which is radiated from the peripheral electronic device, as a noise current, is propagated to the printed circuit board 1 of which the heat radiation board 5 serves as an antenna, but the noise current is propagated to the ground layer 21 of the printed wiring board 2 from the end surface 53 of the heat radiation board 5. Thereby, it is possible to prevent the electromagnetic wave which is radiated from the peripheral electronic device from being propagated to the electronic element 3.

The heat transfer member 4 is stuck to the facing surface 31 of the electronic element 3 and the heat radiation board 5. Thereby, it is possible to eliminate the air layer between the electronic element 3 and the heat radiation board 5, and it is possible to easily transfer the heat which is generated in the electronic element 3 to the heat radiation board 5.

Modification of Embodiment

The invention is not limited to the embodiment described above, and the invention includes a case of being modified or improved within the scope which is capable of achieving the advantage of some aspects of the invention.

In the embodiment described above, the heat radiation board 5 has the bent deformation portion 51 which is bent to the printed wiring board 2, in the portion which reaches to the outer periphery of the heat radiation board 5 from the connection portion 55. However, the shape of the heat radiation board 5 is not limited thereto, and the shape thereof may be other shapes.

Figure 5:
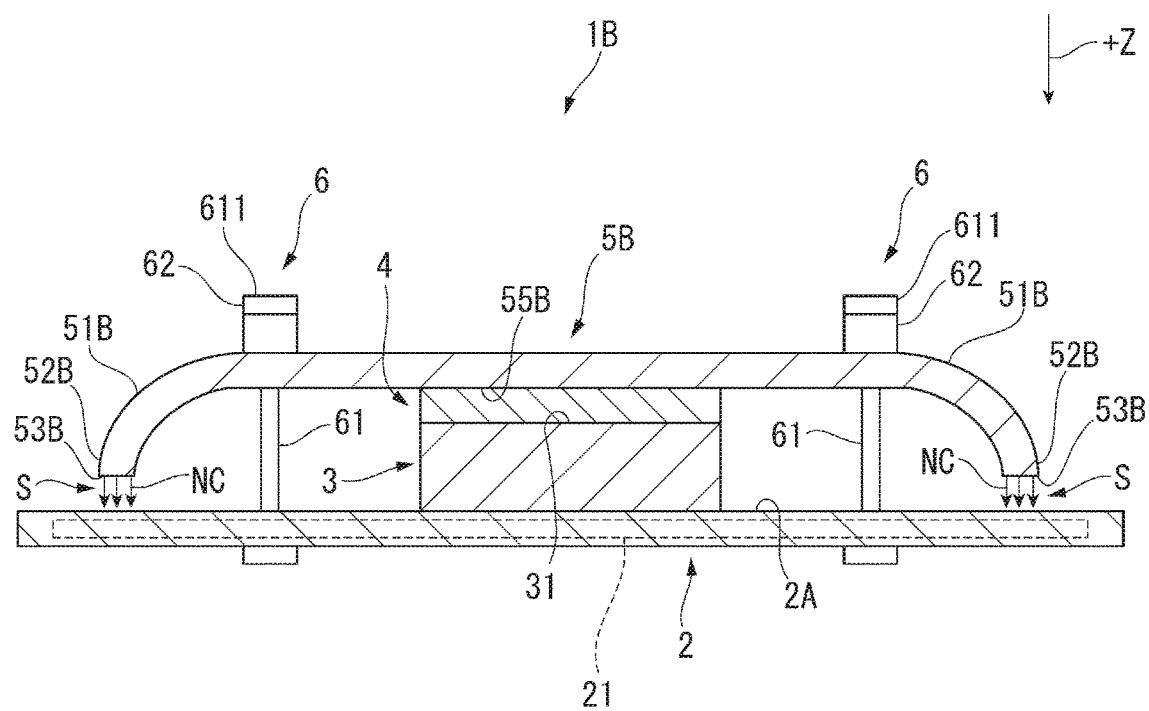
FIG. 5 is a sectional view illustrating Modification Example 1 of the printed circuit board according to the embodiment.
Figure 6:
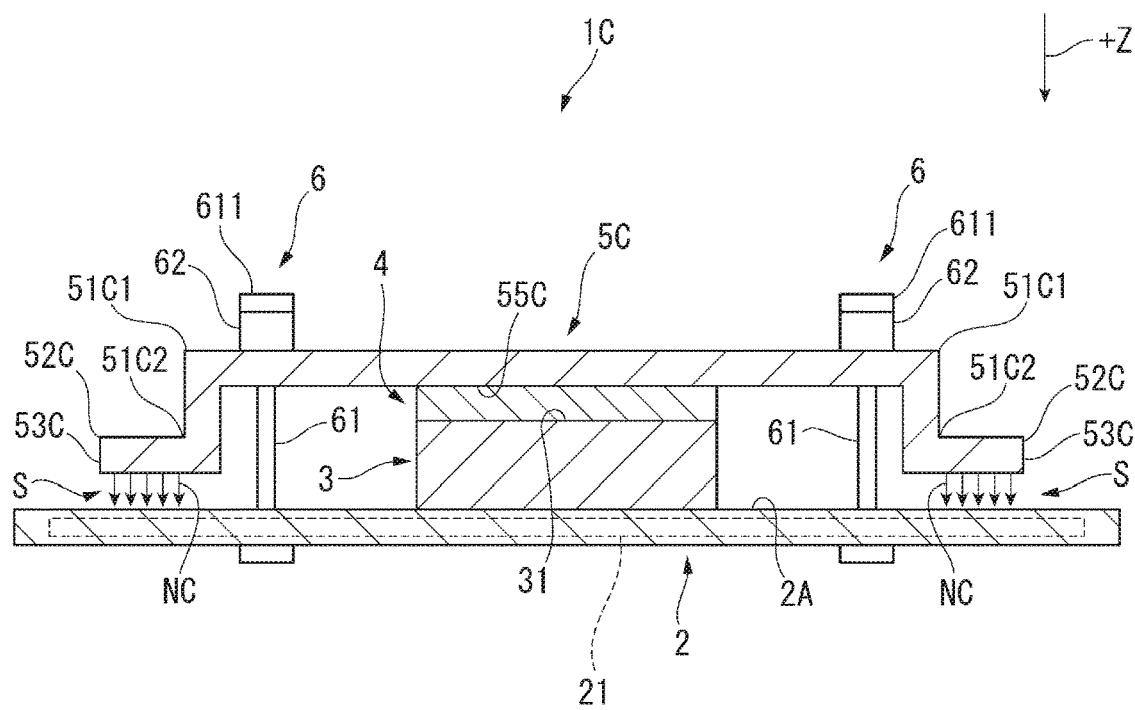
FIG. 6 is a sectional view illustrating Modification Example 2 of the printed circuit board according to the embodiment.

FIG. 5 is a sectional view illustrating a printed circuit board 1B as Modification Example 1 of the heat radiation board 5, and FIG. 6 is a sectional view illustrating a printed circuit board 1C as Modification Example 2.

For example, a heat radiation board 5B illustrated in FIG. 5, and a heat radiation board 5C illustrated in FIG. 6 are metal boards which have the rectangular shapes in the planar view, and of which the notch is provided at each of four corners, in the same manner as the heat radiation board 5 described above. That is, the heat radiation boards 5B and 5C are equivalent to the heat radiation members. However, the heat radiation board 5B illustrated in FIG. 5 has a deformation portion 51B that is curved to the printed wiring board 2, in a portion which reaches to the outer periphery of the heat radiation board 5B from a connection portion 55B of the heat radiation board 5B. That is to say, an end portion 52B of the heat radiation board 5B has a shape which is curved to the printed wiring board 2. The heat radiation board 5B is provided with the deformation portion 51B, thereby, an end surface 53B and the mounting surface 2A of the printed wiring board 2 are disposed to face each other.

In this manner, the end portion 52B of the heat radiation board 5B is disposed closer to the printed wiring board 2 than the connection portion 55B of the heat radiation board 5B, in a state where the space S is provided between the end portion 52B and the printed wiring board 2, in the same manner as the end portion 52 described above. Even with such a heat radiation board 5B, it is possible to achieve the effects which are the same as those of the heat radiation board 5.

The heat radiation board 5C illustrated in FIG. 6 has a bent deformation portion 51C1 that is bent to the printed wiring board 2 (mounting surface 2A), in a portion which reaches to the outer periphery of the heat radiation board 5C from a connection portion 55C of the heat radiation board 5C, and a bent deformation portion 51C2 that is bent to an opposite side (outside of the printed circuit board 1C) of a side on which the electronic element 3 is positioned with respect to the deformation portion 51C1. For the second time, a tip side (end portion 52C side) of the deformation portion 51C1 is bent to a direction which is along the mounting surface 2A of the printed wiring board 2. The deformation portions 51C1 and 51C2 are provided with the heat radiation board 5C, thereby, an end surface 53C and the mounting surface 2A of the printed wiring board 2 are disposed without facing each other, such that the end surface 53C is along the Z direction.

In this manner, the end portion 52C of the heat radiation board 5C is disposed closer to the printed wiring board 2 than the connection portion 55C of the heat radiation board 5C, such that the end surface 53C does not face the printed wiring board 2, in a state where the space S is provided between the end portion 52C and the printed wiring board 2, in the same manner as the end portion 52 described above. The deformation portion 51C2 is provided, thereby, the facing area in the mounting surface 2A facing the surface which is parallel to the mounting surface 2A of the printed wiring board 2 in the deformation portion 51C2 becomes relatively large. Even with such a heat radiation board 5C, it is possible to achieve the effects which are the same as those of the heat radiation board 5.

In the embodiment described above and each Modification Example described above, the end portions 52, 52B, and 52C of four sides in the heat radiation boards 5, 5B, and 5C are configured to be respectively disposed closer to the printed wiring board 2 than the connection portions 55, 55B, and 55C, in the state where the space S is provided between the end portion and the printed wiring board 2, but the configuration thereof is not limited thereto. The configuration thereof may be any configuration so long as at least one of the end portions of four sides in each heat radiation board has such a configuration. The heat radiation boards 5, 5B, and 5C are not limited to the shape having the rectangular shape in the planar view, and may have any shape so long as the shape thereof is a shape having at least one end portion.

In the embodiment described above and each Modification Example described above, each of the end surfaces 53, 53B, and 53C is substantially parallel to the mounting surface 2A. However, the configuration thereof is not limited thereto. For example, a portion of the end surfaces 53, 53B, and 53C may protrude in a tapered shape. A concave portion may be provided in a portion of the end surfaces 53, 53B, and 53C.

In the embodiment described above and each Modification Example described above, the heat transfer member 4 is formed of the sheet which is flexible, and is high in adhesion. However, the configuration thereof is not limited thereto. For example, a heat transfer grease may be applied between the electronic element 3 and the heat radiation board 5, in replacement of the heat transfer member 4. The invention also includes a configuration in which the heat transfer member is not disposed between the electronic element 3 and the heat radiation board 5.

In the embodiment described above and each Modification Example described above, the ground layer 21 is provided at the position corresponding to each end surface of the heat radiation board 5, 5B, and 5C, on the inside of the printed wiring board 2. However, the configuration thereof is not limited thereto, and may be any configuration so long as the ground is provided even at the position corresponding to each of the end surfaces 53, 53B, and 53C of the printed wiring board 2. For example, the ground may be provided in a portion of the position corresponding to each of the end surfaces 53, 53B, and 53C. The ground may be positioned on a surface layer of the printed wiring board 2.

In the embodiment described above and each Modification Example described above, the fixing member 6 attaches the heat radiation boards 5, 5B, and 5C respectively to the printed wiring board 2. However, the configuration thereof is not limited thereto. For example, the heat radiation boards 5, 5B, and 5C may be attached to the printed wiring board 2 by a screw or the like. The heat radiation boards 5, 5B, and 5C may be attached to the electronic element 3 by the screw or the like.

In the embodiment described above and each Modification Example described above, the fixing members 6 are provided as four. However, the configuration thereof is not limited thereto, and three or less fixing members 6 may be provided, and five or more fixing members 6 may be provided.

In the embodiment described above and each Modification Example described above, the biasing member 62 is disposed between the head portion 611 of the fixing member 6 and each of the heat radiation boards 5, 5B, and 5C. However, the configuration thereof is not limited thereto. For example, in the shaft member 61, the biasing member 62 may be disposed between the heat radiation board 5 and the printed wiring board 2. The invention also includes a configuration in which the biasing member is not disposed in the fixing member 6.

In the embodiment described above and each Modification Example described above, one electronic element 3 is mounted on the mounting surface 2A of the printed wiring board 2. However, the configuration thereof is not limited thereto, and it is possible to suitably change the number of electronic elements 3 which are mounted on the mounting surface 2A. At this time, the heat radiation board 5 may be provided in accordance with one electronic element 3, or the heat radiation board 5 may be provided to be connected to each of a plurality of electronic elements 3. The invention also includes a configuration in which the heat radiation board 5 is provided in accordance with at least one electronic element 3 on the mounting surface 2A, and the heat radiation board is not provided in other electronic elements 3.

The entire disclosure of Japanese Patent Application No. 2017-209576, filed Oct. 30, 2017 is expressly incorporated by reference herein.

What is claimed is:

1. A printed circuit board comprising:
a printed wiring board;
an electronic element provided on a mounting surface of the printed wiring board; and
a heat radiation member provided on an opposite side of a side on which the printed wiring board is positioned with respect to the electronic element, the heat radiation member thermally connected to the electronic element, wherein
the heat radiation member is a flat board having a rectangular shape, a notch being provided at each of four corners on an outer periphery of the flat board, and
a surface facing the printed wiring board in an end portion of the heat radiation member is disposed closer to the printed wiring board than a connection portion with the electronic element in the heat radiation member, in a state where a space is provided between the end portion and the printed wiring board such that the surface facing the printed wiring board is not in direct contact with the printed wiring board and such that a propagation path of noise current which is propagated to the printed wiring board from the heat radiation member shortens.

2. The printed circuit board according to claim 1, wherein the end portion has a shape which is bent toward the printed wiring board.

3. The printed circuit board according to claim 1, wherein the end portion has a shape which is curved toward the printed wiring board.

4. The printed circuit board according to claim 1, wherein the mounting surface and the surface facing the printed wiring board in the end portion are parallel to each other.

5. The printed circuit board according to claim 1, further comprising:
a heat transfer member disposed between the electronic element and the heat radiation member.

6. The printed circuit board according to claim 1, wherein the printed wiring board has a ground at a position corresponding to the surface facing the printed wiring board in the end portion.

7. The printed circuit board according to claim 1, further comprising:
a heat transfer member disposed between the electronic element and the heat radiation member and having an end portion that is a surface that is not in contact with the electronic element and the heat radiation member, wherein the end portion of the heat transfer member is not in direct contact with the end portion of the heat radiation member.

8. An electronic device comprising:
the printed circuit board according to claim 1.

* * * * *